(12) United States Patent
Tombez et al.

(10) Patent No.: US 12,584,955 B2
(45) Date of Patent: Mar. 24, 2026

(54) INTEGRATED CIRCUIT WITH ERROR DETECTION CIRCUIT FOR MONITORING CONNECTION WITH AN EXTERNAL COMPONENT

(71) Applicant: Melexis Technologies SA, Bevaix (CH)

(72) Inventors: Lionel Tombez, Bevaix (CH); Sebastien Leroy, Bevaix (CH)

(73) Assignee: MELEXIS TECHNOLOGIES SA, Bevaix (CH)

( * ) Notice: Subject to any disclaimer, the term of this patent is extended or adjusted under 35 U.S.C. 154(b) by 208 days.

(21) Appl. No.: 18/486,221

(22) Filed: Oct. 13, 2023

(65) Prior Publication Data

US 2024/0125844 A1 Apr. 18, 2024

(30) Foreign Application Priority Data

Oct. 14, 2022 (EP) ..................................... 22201551

(51) Int. Cl.
*G01R 31/28* (2006.01)
*G01R 31/00* (2006.01)
*G01R 31/64* (2020.01)

(52) U.S. Cl.
CPC ....... *G01R 31/2853* (2013.01); *G01R 31/001* (2013.01); *G01R 31/64* (2020.01)

(58) Field of Classification Search
CPC ............................ G01R 31/307; G01R 31/343; G01R 19/0092; G01R 31/00; G01R 31/54; G01R 31/50; G01R 31/64; G01R 31/2836; G01R 31/30; G01R 31/56; G01R 27/2605; G01R 31/3275; G01R 31/3173; G01R 31/2853; G01R 31/2843; G01R 31/3181;

G01R 31/3187; G01R 31/66; G01R 31/327; G01R 31/2851; G01R 19/0038; G01R 31/312; G01R 31/315; G01R 31/2856;

(Continued)

(56) References Cited

U.S. PATENT DOCUMENTS

| | | | |
|---|---|---|---|
| 5,589,802 A | 12/1996 | O'Shaghnessy et al. | |
| 7,348,836 B1 * | 3/2008 | Velmurugan | ............. G06F 1/28 |
| | | | 327/545 |

(Continued)

FOREIGN PATENT DOCUMENTS

| | | |
|---|---|---|
| JP | 2000230960 A | 8/2000 |
| WO | 2013093431 A1 | 6/2013 |

OTHER PUBLICATIONS

Extended European Search Report from corresponding EP Application No. 22201551.3, Mar. 28, 2023.

*Primary Examiner* — Vinh P Nguyen
(74) *Attorney, Agent, or Firm* — Workman Nydegger

(57) ABSTRACT

An integrated circuit having an error detection circuit for detecting an error in a connection with an electrical component. The error detection circuit includes a control circuit, a terminal arranged to connect the electrical component, and a driver coupled to the terminal and arranged to be controlled by the control circuit. The driver is arranged to drive a current on receipt of a control signal (Vctl) from the control circuit and the control circuit is further arranged to receive in response to the current a measurement signal via the terminal, to determine based on a characteristic of the measurement signal a possible error and to communicate an error signal based on the determining.

14 Claims, 6 Drawing Sheets

(58) Field of Classification Search
CPC .. H03K 2217/0027; H03K 17/18; H03K 5/19;
G06F 11/221; G06F 13/4072; G06F
11/3058; G06F 1/3215; G06F 11/27;
G06F 11/273; G06F 11/00; G06F
11/3672; G06F 13/4068; G06F 11/24;
G06F 11/08
See application file for complete search history.

(56)                References Cited

U.S. PATENT DOCUMENTS

| | | | | |
|---|---|---|---|---|
| 9,383,400 | B2 * | 7/2016 | Durston | ................. G01R 31/64 |
| 11,092,633 | B2 * | 8/2021 | Shimada | ............. G06F 3/04166 |
| 11,994,890 | B2 * | 5/2024 | Schomacker | ............ G05F 1/46 |
| 12,352,794 | B2 * | 7/2025 | Zeng | .................. G01R 27/2605 |
| 12,455,174 | B2 * | 10/2025 | Ghezzi | ..................... G01D 1/14 |
| 2020/0256928 | A1 | 8/2020 | Tsutsumi et al. | |
| 2022/0129025 | A1 | 4/2022 | Schomacker et al. | |

* cited by examiner

INTEGRATED CIRCUIT WITH ERROR DETECTION CIRCUIT FOR MONITORING CONNECTION WITH AN EXTERNAL COMPONENT

FIELD OF THE INVENTION

The present invention is generally related to the field of circuits and methods with self-test capability which allows for obtaining information regarding a circuit component.

BACKGROUND OF THE INVENTION

Integrated circuits, such as e.g., sensor integrated circuits, usually need decoupling capacitors to decouple the integrated circuit (IC) from other parts of the system. In this way the IC can be isolated from noise and power anomalies originating from other circuit elements. Low-frequency changes in the input supply voltage (e.g., micro-interruptions) can so be dealt with as well as high-frequency noise from various sources (for example, perturbations due to electromagnetic interference (EMI)).

Sometimes an external capacitor is used for decoupling an internal regulated voltage, such as a regulated voltage for the internal analog circuitry of the IC, or a regulated voltage for an internal digital circuitry, or for both. One or more external decoupling capacitors may also be used at an output of an integrated circuit, for decoupling the output terminal of the circuit (e.g., a sensor output). An external discrete capacitor is often used because the required capacitance value is usually too high to be integrated in the integrated circuit itself.

In general, a decoupling capacitor makes the internal supply voltage provided by the regulator or the output voltage more robust to electromagnetic perturbations and/or voltage drops from the main supply.

In US2022/129025 A1 a device for determining information about a connection of a decoupling capacitor connected to an output of a voltage regulator in order to reduce output signal fluctuations at the regulator output. The device includes a processing unit that computes the variance of the fluctuating measurement signals, and thus of the output signal at the regulator output. Based on the variance it is determined whether the decoupling capacitor is missing or not.

A missing external decoupling capacitor and/or a missing connection to an external decoupling capacitor may lead to faulty operation of the integrated circuit or of the system comprising the integrated circuit under certain circumstances. Hence, there is a need for providing an integrated circuit with a self-test capability such as to detect a missing decoupling capacitor over the lifetime of the circuit and during its operation, i.e. after manufacturing.

SUMMARY OF THE INVENTION

It is an object of embodiments of the present invention to provide for an error detection circuit that allows monitoring an external component and/or the connection of the external component to a circuit of which the error detection circuit is part. The invention also relates to a circuit, preferably an integrated circuit, comprising the error detection circuit. In a further aspect the invention relates to a system comprising the circuit and an external component connected to the circuit. The invention further relates to a method for detecting an error of a decoupling capacitor connected to an integrated circuit.

The above objective is accomplished by the solution according to the present invention.

In a first aspect the invention relates to an error detection circuit for detecting an error in a connection of an electrical component. The error detection circuit comprises:
- a control circuit,
- a terminal arranged to connect the electrical component,
- a driving means, coupled to the terminal and arranged to be controlled by the control circuit, whereby the driving means is arranged to drive a current on receipt of a control signal from the control circuit and whereby the control circuit is further arranged to receive in response to that current a measurement signal via the terminal, to determine based on a characteristic of the measurement signal a possible error and to communicate an error signal based on said determining.

The proposed solution indeed allows for connecting an external electrical component thanks to availability of the terminal and for so obtaining a measurement signal related to the external component and its connection. When the driving means receives a control signal from the control circuit, a driving current is launched and in response to this current, the control circuit receives a measurement signal. A characteristic of this measurement signal is next used to check whether or not an error has occurred. In preferred embodiments this determination can be performed by means of a comparison with some threshold value. Based on the determination, e.g., the comparison, a decision can be taken on whether the external component is properly working and/or properly connected and a corresponding error signal indicating an error or no error can be communicated.

In a preferred embodiment the error detection circuit comprises a switch configured to control the input voltage signal under control of the control circuit. In some embodiments the switch either passes or blocks the incoming signal. In other embodiments the switch adapts the incoming signal to a lower amplitude, whereby there is only a partial passing or blocking of the input signal.

In some embodiments the driving means is a transistor, a current source or a switch. Alternatively, the driving means may be a DC/DC converter or some load, for example a resistor, a capacitor, an inductor, or a combination thereof.

The characteristic of the measurement signal that is used in the comparing, may in some embodiments be the amplitude of a voltage signal or a current signal, or the slope of a voltage or of a current, or an integral of a current, or an integral of a voltage signal.

In some embodiments the error detection circuit comprises at least one further terminal adapted to output a further signal.

In preferred embodiments the measurement signal is a transient signal. This offers the advantage that it allows for a quick check of the state of the connection.

In another aspect the invention relates to an integrated circuit comprising an error detection circuit as previously described.

In a preferred embodiment the input voltage of the error detection circuit is a regulated voltage from a voltage regulator comprised in the integrated circuit.

In one embodiment the input voltage received in the error detection circuit is lower than a supply voltage of the integrated circuit.

In one embodiment the driving means is connected to a ground point of the integrated circuit. In another embodiment the driving means is connected to a voltage different from the ground point of the integrated circuit.

Advantageously, the integrated circuit comprises a sensor and an output terminal for a sensor signal generated by the sensor.

In some embodiments the driving current is a transient signal, i.e. a momentary variation of current. In some cases the driving current can be a current pulse. In other embodiments the driving current can be a constant signal (e.g., when the external decoupling capacitor discharges at constant current).

In another aspect the invention relates to a system comprising an integrated circuit as previously described, wherein a decoupling capacitor is connected to the terminal of the error detection circuit.

Advantageously, the control circuit is arranged to compare with the predefined threshold a voltage over the decoupling capacitor, a discharge current or a discharge time constant.

In yet a further aspect the invention relates to a method for detecting an error of a decoupling capacitor connected to an integrated circuit, the method comprising:

providing an integrated circuit as previously described, initiating via the control circuit and the driving means of the error detection circuit of the integrated circuit a discharging or charging of the decoupling capacitor, measuring a signal resulting from said discharging or charging, determining based on a characteristic of the measurement signal whether there is an error, communicating an error signal based on said determining.

In one embodiment the comparing is performed at a predetermined time after the activation of the driving means.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The above and other aspects of the invention will be apparent from and elucidated with reference to the embodiment(s) described hereinafter.

BRIEF DESCRIPTION OF THE DRAWINGS

The invention will now be described further, by way of example, with reference to the accompanying drawings, wherein like reference numerals refer to like elements in the various figures.

DETAILED DESCRIPTION OF ILLUSTRATIVE EMBODIMENTS

Figure 1:
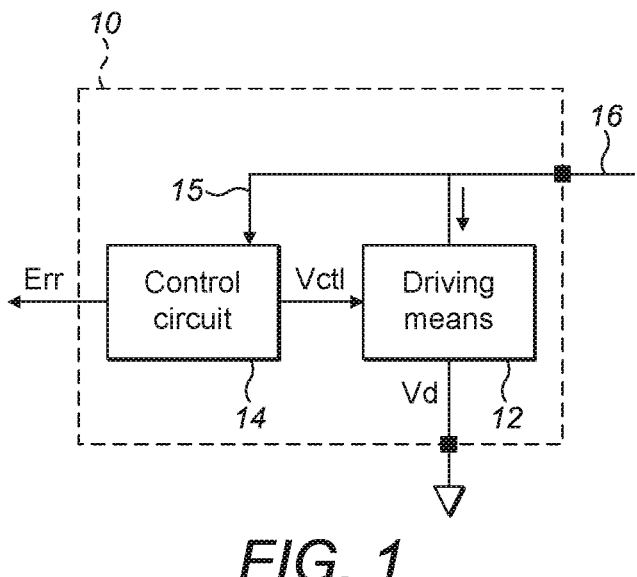
FIG. 1 illustrates an embodiment of an error detection circuit according to the present invention.

The present invention will be described with respect to particular embodiments and with reference to certain drawings but the invention is not limited thereto but only by the claims.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

It should be noted that the use of particular terminology when describing certain features or aspects of the invention should not be taken to imply that the terminology is being re-defined herein to be restricted to include any specific characteristics of the features or aspects of the invention with which that terminology is associated.

In the description provided herein, numerous specific details are set forth. However, it is understood that embodiments of the invention may be practiced without these specific details. In other instances, well-known methods, structures and techniques have not been shown in detail in order not to obscure an understanding of this description.

The present invention proposes an error detection circuit that, when an external component is connected, allows checking the state of that connection and/or of the component in question.

A block scheme of an error detection circuit according to the present invention is depicted in FIG. 1. The error detection circuit (10) comprises a control circuit (14). The control circuit controls a driving means (12) by means of control signals (Vctl). The driving means is connected to a voltage node Vd. The error detection circuit further comprises a terminal (16), via which for example an external electrical component can be connected to the circuit. In some embodiments the terminal may be an output terminal of an integrated circuit in which the error detection circuit is comprised.

The driving means (12), sometimes shortened to driver in this description, can be implemented in various ways. In one embodiment it can be a current source, such as a digitally controllable current source. In another embodiment the driver is a transistor or a transistor with a load. The load can be for example a resistor or a capacitor or a circuit comprising one or more resistors or capacitors. The load may be a resistor R, a capacitor C or an inductor L, or any combination thereof, yielding an RC or RL or RLC circuit. More examples of driving means are provided later in this description.

When the driving means receives a control signal (Vctl) from the control circuit, the driving means drives a current that will provoke a response in the electrical component connected to the error detection circuit, for example a charging or discharging in case the electrical component is an external decoupling capacitor. The control circuit then receives in turn via the terminal (16) a measurement signal (15), for example a discharge current or voltage signal in the example of a decoupling capacitor. A comparison of a characteristic of the measurement signal to a predefined threshold value is next performed to check whether or not there is a connection error. A corresponding error signal (Err) is then emitted by the control circuit to indicate whether or not an error is observed. For example, in some embodiments the characteristic of the measurement signal may be affected by the output impedance of the circuitry connected to the error detection circuit (e.g., a Low Drop Out (LDO) regulator) and the status of the electrical component. A missing component can so be detected. The error signal can be an analog signal, or a digital signal (e.g., a 1-bit digital signal). It can also be communicated using a digital protocol, e.g., a standard digital protocol such as SPI, or I2C, or SENT.

Figure 2:
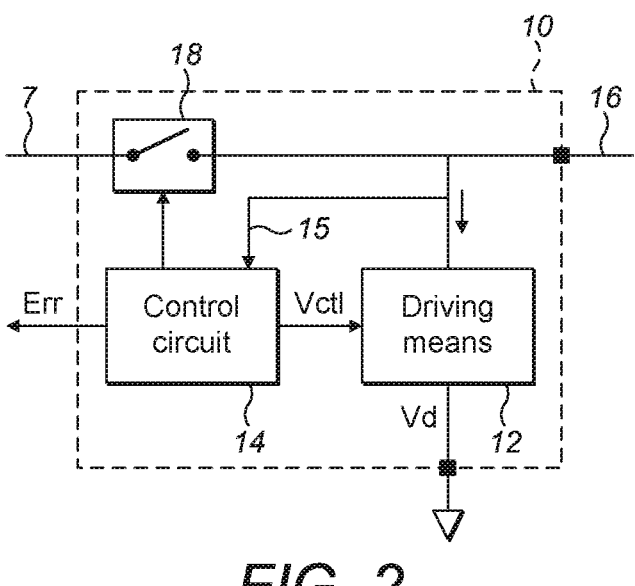
FIG. 2 illustrates an embodiment of an error detection circuit according to the present invention.

Another embodiment of the error detection circuit is illustrated in the block scheme of FIG. 2. The error detection circuit (10) receives an input voltage signal (7), which can either be an analog signal or a digital signal. The error detection circuit of FIG. 2 scheme also comprises a switch (18) that can control the input voltage signal. This switch, however, is not required but rather optional. The switch operates under control of the control circuit. The switch may in some embodiments switch between a state wherein the input signal is completely blocked and a state wherein the input signal is completely passed. In other embodiments the input signal may only be partially blocked or passed. The switch can for example be implemented using a transistor, such as a MOSFET.

In some embodiments where a switch (18) is present, an internal decoupling capacitor may be provided to replace the external decoupling capacitor while the disconnection test is performed. The internal decoupling capacitor, typically with a lower capacitance, is connected before the switch (e.g., between the input voltage signal to the error detection circuit and VSS), such that it can provide a buffer to the circuitry while the switch (18) and the external capacitor are disconnected during the diagnostic process.

The input voltage (7) may in some embodiments be a supply voltage VDD of an integrated circuit the error detection circuit is a part of. It may also be a regulated voltage VR obtained from a voltage regulator provided in the integrated circuit. That regulator voltage VR is then typically smaller than the supply voltage. The input voltage may also be a sensor signal to be communicated and exported via the terminal (16). Also the control circuit (14) may be supplied by the main supply voltage VDD. In other embodiments the control circuit may be supplied by a regulated voltage (e.g., the input voltage).

Figure 3:
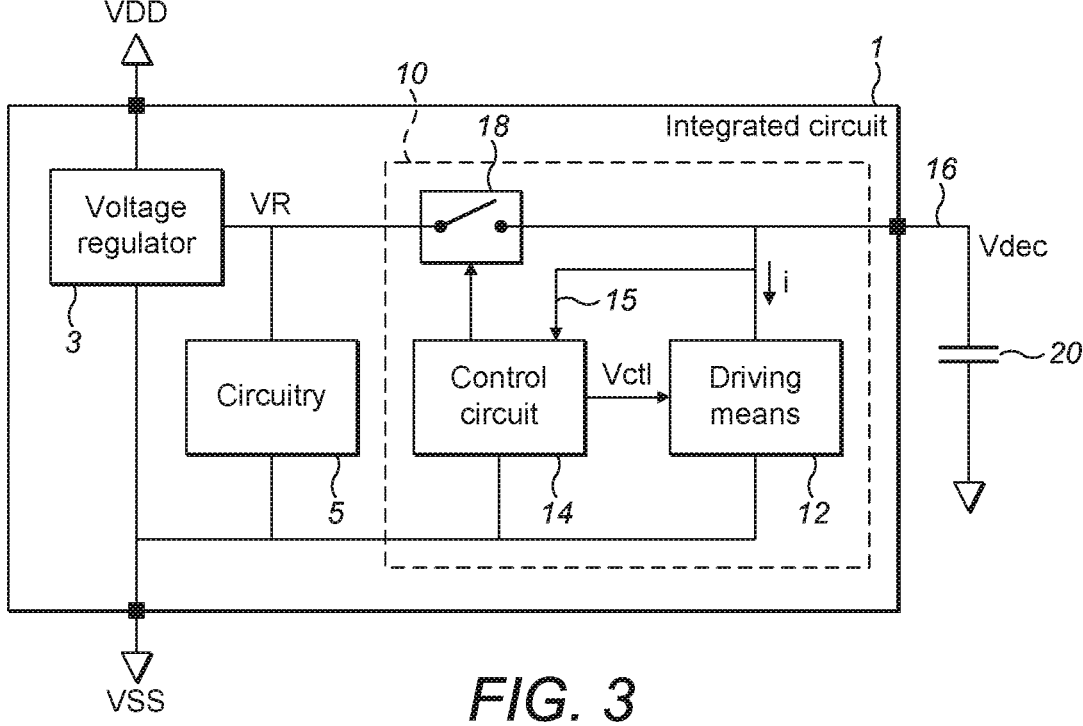
FIG. 3 illustrates an embodiment of an integrated circuit comprising an error detection circuit of the invention.

FIG. 3 illustrates a preferred embodiment wherein the error detection circuit (10) is part of an integrated circuit (1). The integrated circuit comprises in this embodiment a voltage regulator (3), which receives a supply voltage VDD. The voltage regulator outputs a regulated voltage signal VR which is also the input signal to the error detection circuit. In preferred embodiments the regulated voltage VR is smaller than the supply voltage VDD. In some embodiments, as in FIG. 3, the regulated voltage signal VR is also applied to a circuitry (5) of the IC. In other embodiments a separate voltage regulator may be provided for the circuitry (5). In yet another embodiment the integrated circuit may contain no voltage regulator at all.

The circuitry (5) can be a circuit comprising analog or digital blocks. Typically, one or more sensing means are connected to the circuitry. Examples are magnetic sensors, pressure sensors, current sensors, position sensors, accelerometers. The circuitry as well as the voltage regulator, is connected to a ground point VSS. In this embodiment also the driving means is connected to the ground point (i.e. Vd=VSS). The optional switch (18) can also be used to disconnect the voltage regulator (3) from the error detection circuit (10). Note that in the scheme of FIG. 3 an external passive component, in this case a capacitor (20), is connected to the integrated circuit via the terminal of the error detection circuit. In other embodiments the external component can be an active component, such as a buffer amplifier of microcontroller analog pin, or digital pin. Note that in FIG. 3 the terminal of the error detection circuit is also an output terminal of the integrated circuit.

Figure 4:
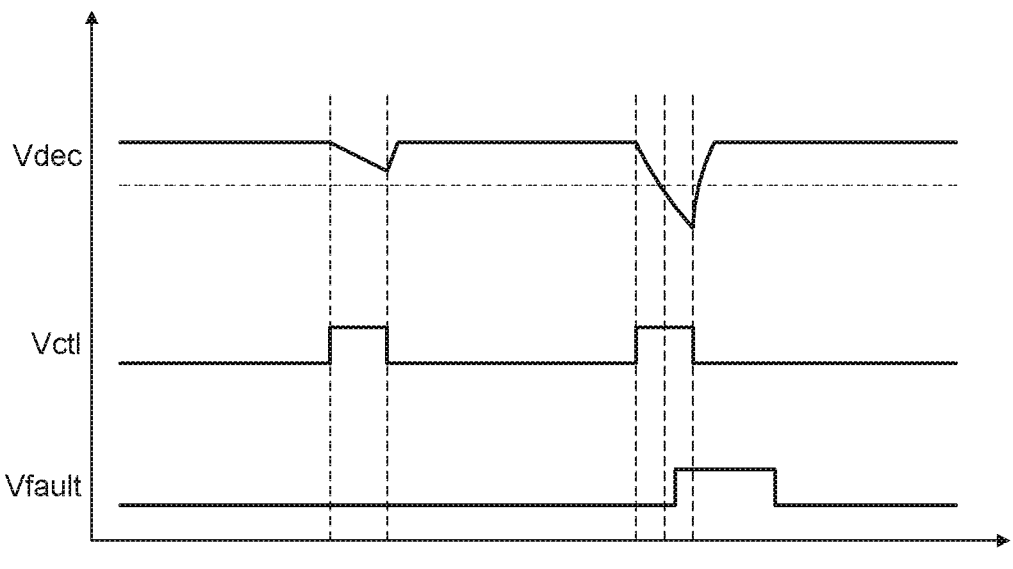
FIG. 4 illustrates the detection of a connection error.

A possible way to detect an error in the connection of the external component to the error detection circuit in a scheme as in FIG. 3 is now explained. The graphs depicted in FIG. 4 are thereby provided as further illustration. The capacitor voltage Vdec over the external decoupling capacitor is monitored in this example, see the top row in FIG. 4. This monitoring is initiated by the control circuit sending a control signal Vctl to the driving means (see FIG. 3). The signal Vctl is shown in the middle row of FIG. 4. As shown in the left part of FIG. 4, when a signal Vctl in its high state is received, the driving means are enabled and the driving current is launched, which initiates the discharge of the external capacitor by creating a conducting path between Vdec and VSS, thereby forcing a current to flow from the capacitor to ground. The measured capacitor voltage signal is received in the control circuit. The capacitor voltage signal Vdec itself may in some embodiments also be used to supply the control circuit. In this case, the supply current of the control circuit may contribute to the discharge current. Based on the measured voltage it is checked whether or not an error has occurred. In the example of FIG. 3 and FIG. 4 a voltage threshold level is predetermined in the control circuit. The control circuit performs for example a comparison of the measured signal, or a quantity derived thereof, with the threshold level. An alternative may be to determine a possible error based on a characteristic like a time constant. In this example a voltage check is performed in the control circuit at regular points in time, but this does not necessarily have to be like that. For example, in some embodiments a monitoring can be performed only once, i.e. only one signal to trigger the capacitor discharging (or, stated in general, to trigger a reaction from the external electrical component) is emitted by the driving means. The comparison can be performed while the driving means are enabled, or shortly thereafter, i.e. when the capacitor voltage Vdec increases back to its nominal value.

In the example of FIG. 4, when the capacitor is discharged the first time, the capacitor voltage decreases but remains above the given threshold level. From this behaviour it can be concluded that the external decoupling capacitor is present and correctly connected. Some time later a next discharging and subsequent check takes place (right hand part of FIG. 4). In this case it is observed in the control circuit that the capacitor voltage decreases below the threshold level. The discharge behaviour is then governed by the parasitic capacitance, which is much smaller than the capacitance of the external capacitor. Consequently, the control circuit launches a fault signal Vfault. In the embodiment shown in FIG. 4 the error signal Vfault is somewhat delayed compared to the crossing of the threshold level. In other embodiments this delay might be zero.

Although in FIG. 4 a rectangular pulse shaped control signal Vctl is shown, the skilled person will readily recognize that many alternatives can be envisaged for the shape of the control signal. For example, triangular shaped pulses can be applied. In some embodiments a bandwidth-limited pulse might be used.

The measurement signal is not shown in FIG. 4, but also that signal may take different shapes. Various alternatives can be distinguished. The driving signal may for example be tweaked such that the generated measurement signal is a constant voltage or current signal. Hence, the discharging then occurs at constant voltage or constant current. In other embodiments the driving signal may be a constant current for example.

Whereas in the example of FIG. 4 the quantity related to the measured signal used for further processing (comparison to a threshold) is the amplitude of the capacitor voltage signal, many alternatives are available. In some embodiments the quantity is a time constant observed when discharging the capacitor. In other embodiments the discharge current amplitude is the measured quantity or the integral of the discharge current (in other words, the amount of charge). In some embodiments more than one quantity can be used for performing the comparing, for example the amplitude of both current and voltage amplitude signal.

The control circuit (14) can be an analog circuit, or a digital circuit, or a mixed-signal circuit. Its various tasks of controlling the driver, receiving the measurement signal and outputting an error signal can be implemented using analog and/or digital circuits, e.g., a CMOS circuit. For example, the controlling function can be implemented using digital logic. The control circuit may comprise an analog-to-digital converter arranged for receiving and digitizing the measurement signal. Alternatively or additionally, it may comprise one or more comparators (e.g., outputting a 1-bit signal). The analysis part can be implemented using software. The control circuit may also comprise an integrator, or differentiator to support the analyses. The quantity derived from the measured signal applied to the control circuit and used for the further processing can be analog or digital. Appropriate digital-to-analog conversion means may be provided in the control circuit.

The characteristic used in the control circuit to make the comparison and next decide on the possible occurrence of an error, was in the above example the amplitude of the capacitor voltage. In other embodiments the amplitude of the discharge current can be exploited or the derivative (the slope) of voltage or current. In yet other embodiments the comparison in the control circuit may be based on an integral of the measured signal (e.g., the integral of the discharge current). It may also be that the comparison is performed using more than one characteristic.

In some embodiments the comparison in the control circuit is performed once each time a control signal has been sent to the driving means. In other embodiments the comparison may be made several times or even continuously or quasi-continuously.

Figure 5:
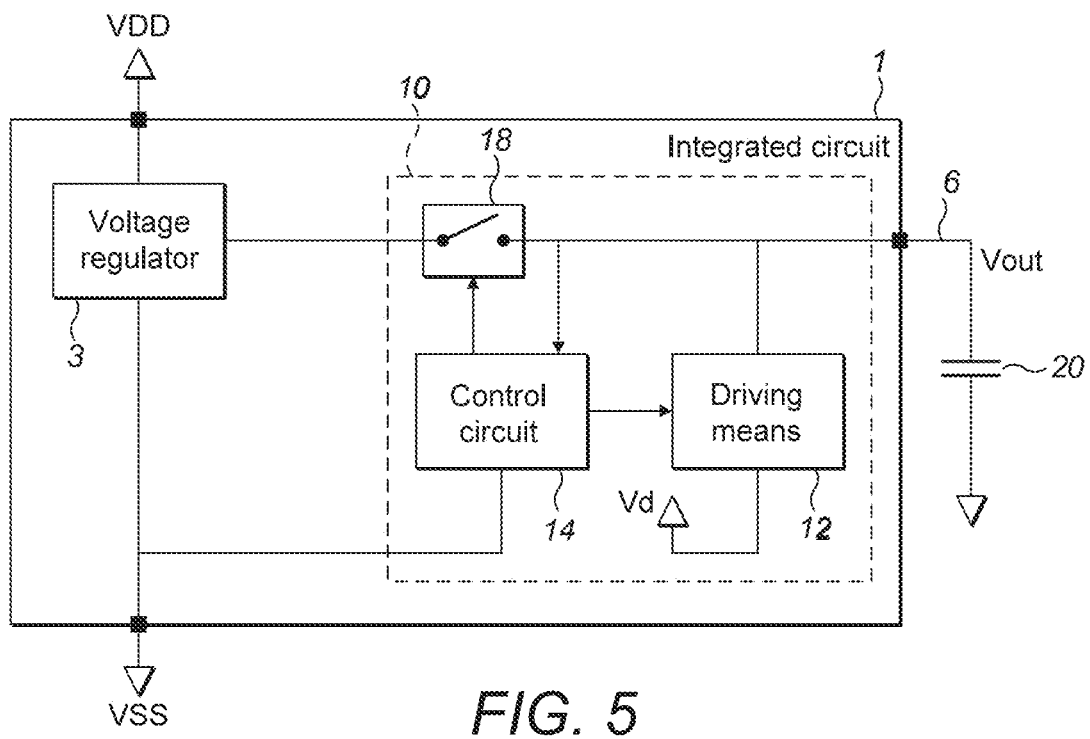
FIG. 5 illustrates an embodiment of an integrated circuit comprising an error detection circuit of the invention.

In the embodiment depicted in FIG. 5 the error detection circuit is arranged to detect a missing or faulty capacitor (20) at the circuit output terminal (e.g., for outputting a sensor output signal, such as a digital or analog sensor signal). Hence, the output terminal of the integrated circuit and the terminal of the error detection circuit are one and the same, or they are at least electrically connected with one another. In FIG. 5 the voltage node Vd is not connected to VSS. Note that also in other embodiments presented in this description it is possible that voltage node Vd is not connected to VSS. Vd can be a regulated voltage. For example, Vd can be comprised between VSS and VDD, or between regulated voltage VR and VSS (assuming a voltage regulator is present). An advantage of the embodiment in FIG. 5 is that the discharging of the external component is limited to Vd, i.e. Vout does not go lower than Vd. An advantage in this case is that the timing of the discharge pulse is less critical and does not need to be precisely controlled as Vout will not go lower than Vd.

Figure 6:
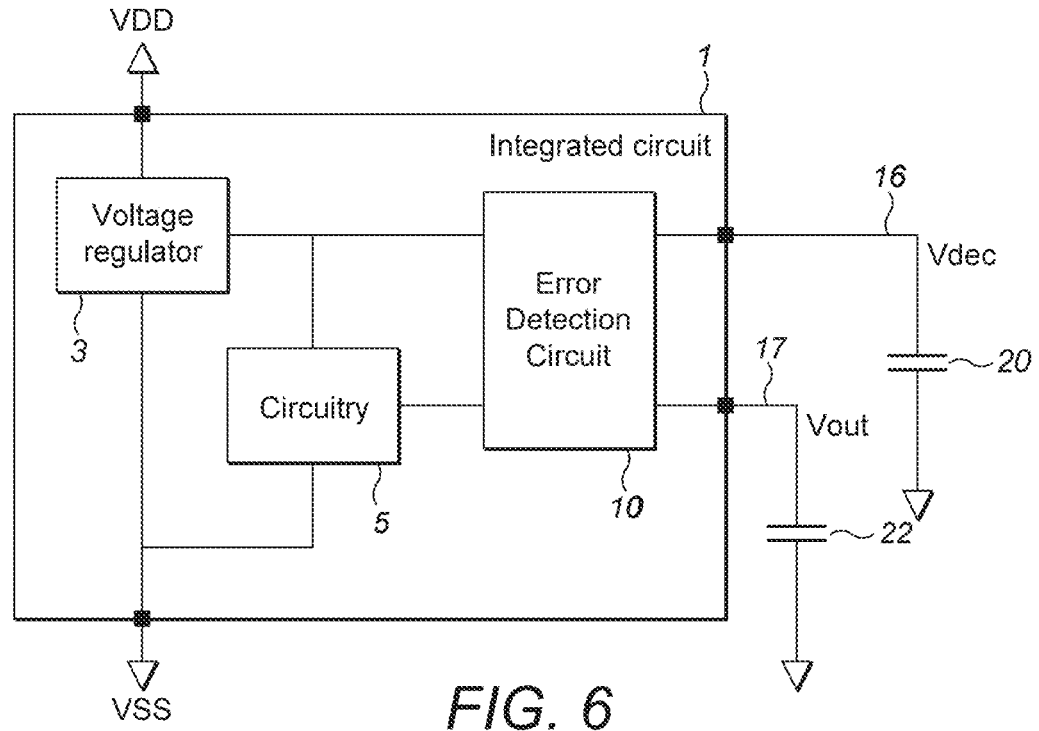
FIG. 6 illustrates an embodiment of an integrated circuit comprising an error detection circuit of the invention.

In the embodiment illustrated in FIG. 6 the integrated circuit comprises multiple terminals. In contrast with FIG. 5, there is now additionally a separate terminal (16) for the error detection circuit to which a decoupling capacitor Cdec is connected and another output terminal (17) of the IC to which another electrical component (22) (e.g., a filtering capacitor) or circuit may be connected. Multiple terminals can be checked, e.g., a regulator decoupling capacitor and an output decoupling capacitor. In some embodiments the error detection circuit may be duplicated for each capacitor (not shown). In an embodiment, a same error detection circuit (10) according to the invention is used to test multiple capacitors, e.g., using a multiplexer circuit or a switch matrix. Note that in the example of FIG. 6 there are two input voltages. In yet another embodiment the driving means of the error detection circuit leverage the presence of the second external capacitor to discharge the first one into the second one, and vice versa. For that, it is assumed that the voltage on the output terminals (16) and (17) are significantly different.

Figure 7:
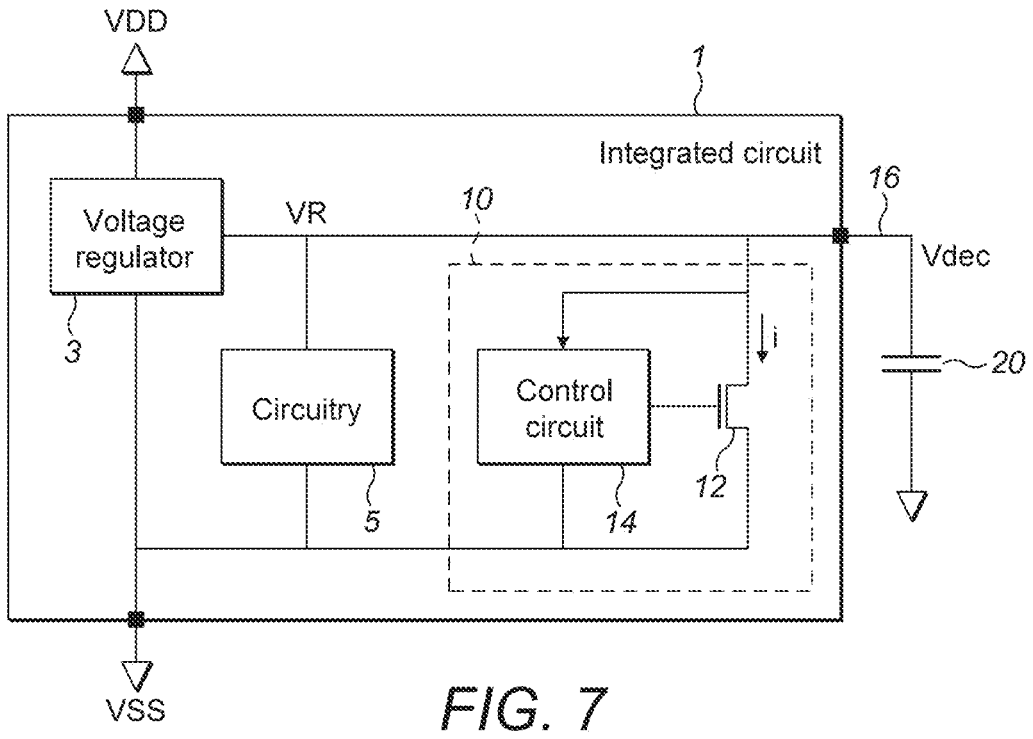
FIG. 7 illustrates an embodiment of an integrated circuit comprising an error detection circuit of the invention.

In the embodiment depicted in FIG. 7, the driving means is implemented as a transistor. The transistor can be operated as a switch (i.e. a very low resistive path), such that the capacitor is connected to VSS in this example. (In another example the capacitor may be connected to a voltage node Vd.) An exponential decay of the capacitor voltage is so generated. In other embodiments the transistor can be operated as a controllable current source. In this case a constant discharge current may be applied to the external component, which will generate a linear decrease of the capacitor voltage. In some embodiments the current may be variable, for example to generate a different desired shape in the measurement signal. As already mentioned previously, a single measurement cycle can be triggered once in a while, or multiple subsequent measurement cycles can be triggered.

Figure 8:
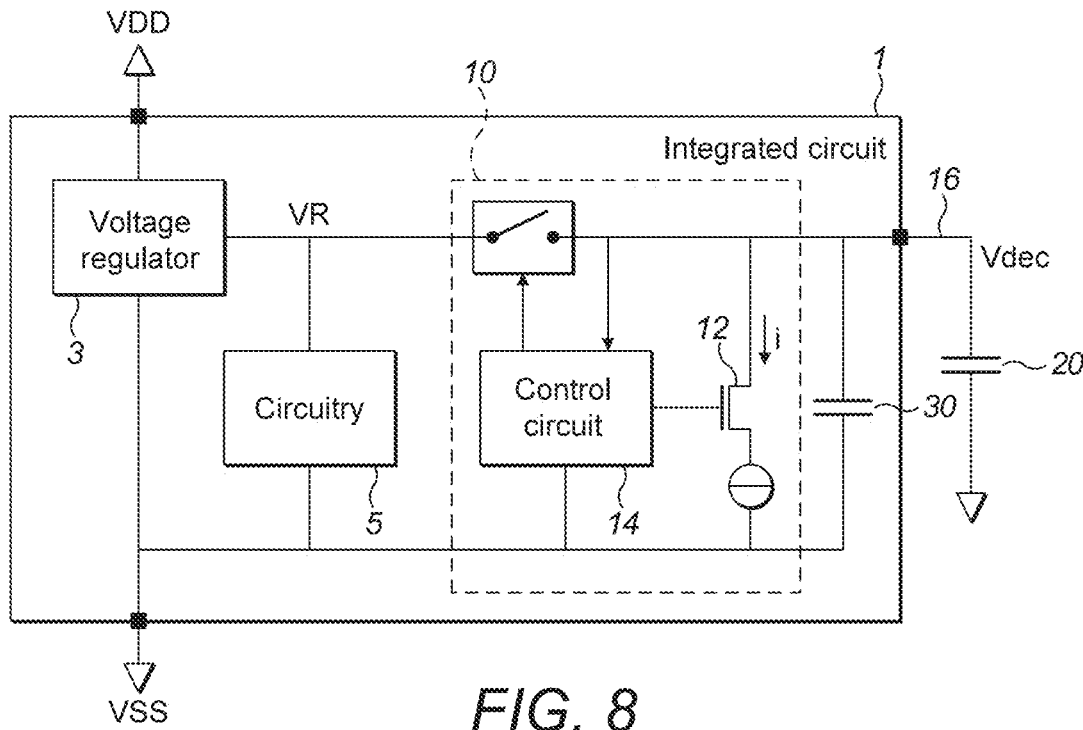
FIG. 8 illustrates an embodiment of an integrated circuit comprising an error detection circuit of the invention.
Figure 9:
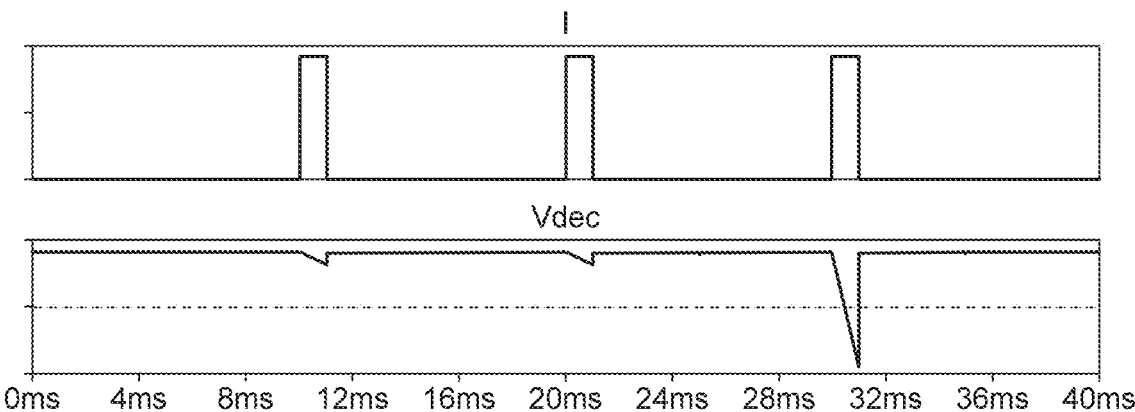
FIG. 9 illustrates the driving current and the behaviour of the decoupling capacitor voltage obtained with the scheme of FIG. 8.

In FIG. 8 the transistor is operated like a switch (i.e. a very low resistive path) and connects a current source providing a fixed predefined current. This generates a discharging of the capacitor at constant current, thereby Vdec displays a linear slope. The integrated circuit comprises in this embodiment also an internal decoupling capacitor (30) apart from the external capacitor Cdec (20). The internal decoupling capacitor connected in parallel typically has a capacitance 10 times or 50 times or 100 times or 1000 times lower than the external capacitor. The internal decoupling capacitor may have a capacitance of, for example, 10 pF or 1 nF. The internal decoupling capacitor may be a parasitic capacitor. Note that such an internal decoupling capacitor may also be present in other embodiments than the one shown in FIG. 8, for example in the embodiments illustrated in other figures. The advantage of having an internal decoupling capacitor is that the behaviour of the measurement signal in response to the current pulses can be predefined in case of a missing or faulty external capacitor. FIG. 9 illustrates the driving current with constant value and the substantial drop of the capacitor voltage Vdec after about 30 ms below a predefined threshold (indicated by a dashed line), indicating a faulty or missing capacitor. Another possible approach may be to consider the slope of the measurement signal, or the integral, or any combination of voltage magnitude, slope and integral of the measurement signal. The duration of the pulses and magnitude of the drive current (in other words, the total charge drawn from the capacitors) may be selected such that the voltage drop in case of an absent decoupling capacitor remains at a level ensuring a proper operation of the circuit (5), for example more than 80% VR, or more than 90% VR.

Figure 10:
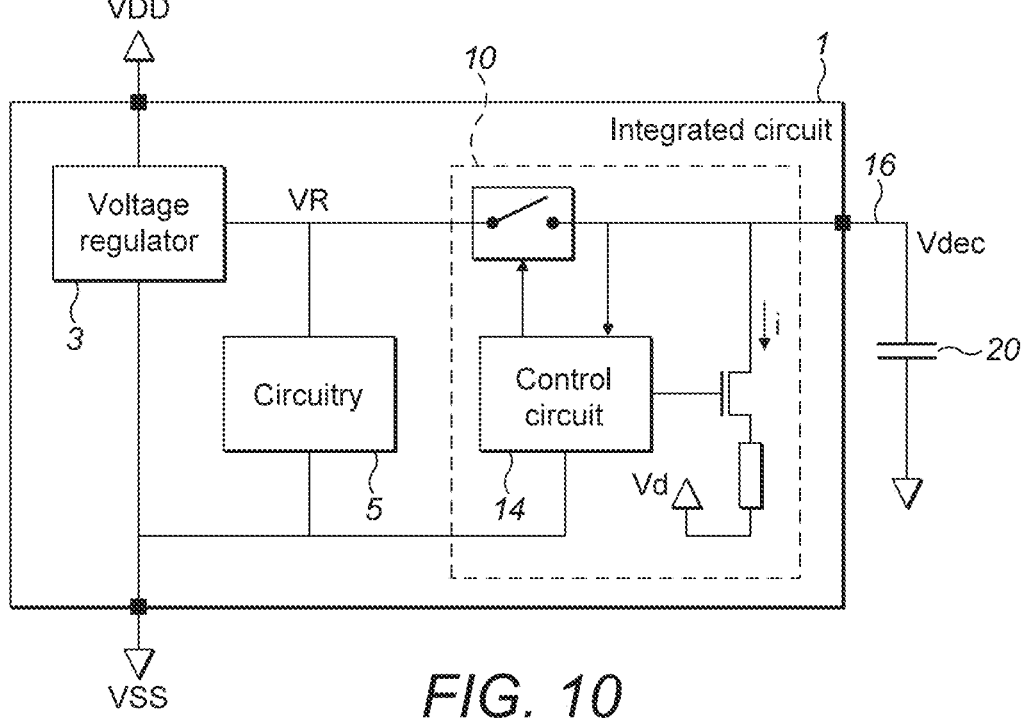
FIG. 10 illustrates an embodiment of an integrated circuit comprising an error detection circuit of the invention.

In the embodiment depicted in FIG. 10 the transistor is operated as a switch, and connects a load (e.g., a resistance) to a voltage node Vd, for example a regulated voltage. The resistor value defines the time constant and Vd the minimum voltage. The minimum voltage may be selected such that Vdec remains at a level guaranteeing a proper operation of the circuit (5) (e.g., 90% VR) during the current pulses.

Figure 11:
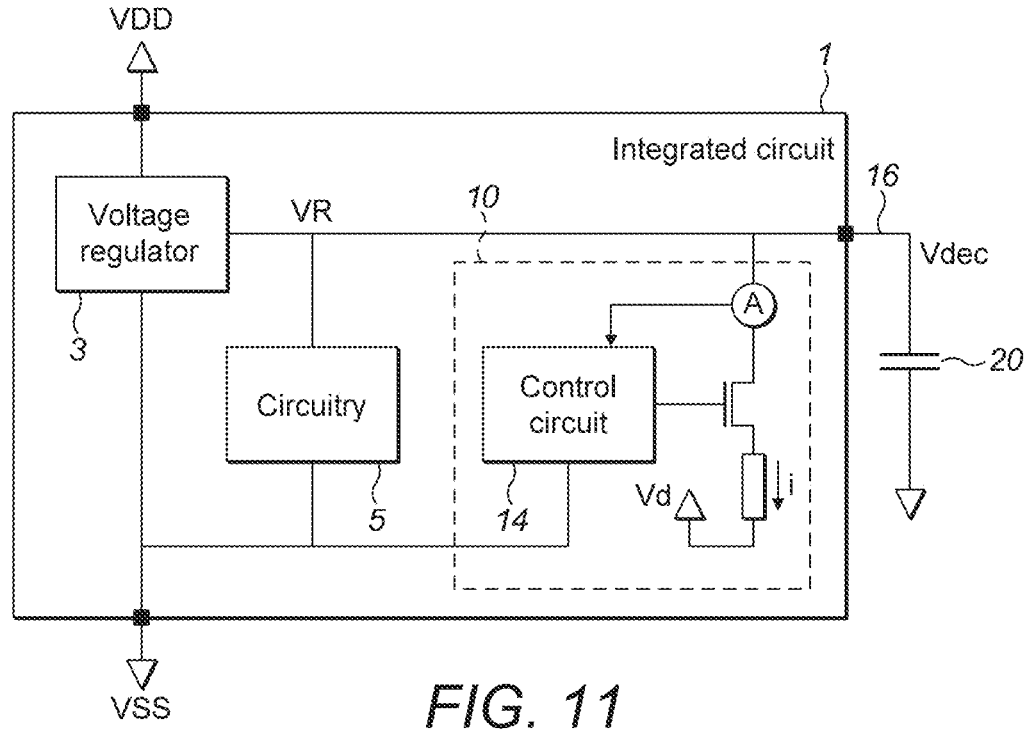
FIG. 11 illustrates an embodiment of an integrated circuit comprising an error detection circuit of the invention.

In the embodiment of FIG. 11 the current is measured. The current can be measured using current sensing means A, such as a shunt resistor. In an embodiment, the voltage drop across the load can be used as a current sensing signal (in this case the load takes the role of the current sensing means). Again, the measure current or a characteristic derived thereof can be used to determine if possibly an error has occurred or not. An error signal indicative of an error (or of no error) is communicated based on the determination (not shown in the figure).

Figure 12:
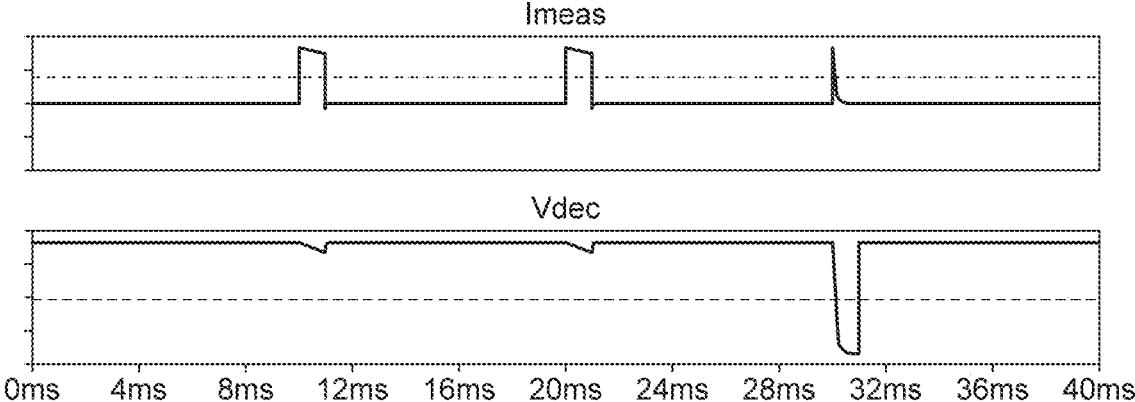
FIG. 12 illustrates the driving current and the behaviour of the decoupling capacitor voltage obtained with the scheme of FIG. 11.

A possible current behaviour is illustrated in FIG. 12. In normal operation the measured current magnitude Imeas slightly decreases when the decoupled voltage Vdec decreases due to the discharging of the capacitor. The current magnitude Imeas remains above the threshold (dashed line) indicating that no fault is detected. After about 30 ms a sudden drop of the measured current is observed due to a substantial drop of the capacitor voltage and Imeas crosses the threshold. This may be an indication of a missing or faulty capacitor. Note that a same observation could be made by observing the time constant, the slope (derivative) or the integral of the measurement signal, or any combination thereof. For example, the time constant, the slope and/or the integral may be compared to a predefined threshold. In some embodiments both the current and voltage can be measured. One or more characteristic of each signal can be compared with a given threshold level value for example and an error signal can be issued only if both signals indicate a missing capacitor. This offers the advantage that the risk of a false-positive is lowered. As explained earlier, it may be observed that Vdec tends to a predefined minimum voltage, which may be selected to ensure a proper operation of the circuitry.

The invention also relates to a system comprising an external decoupling capacitor and an integrated circuit provided with an error detection circuit. In some embodiments the external decoupling capacitor can be integrated in the same package as the integrated circuit, e.g., in a Single Mould Package (SMP), without being limited thereto. The external capacitor can be in some embodiments be a ceramic capacitor or an electrolyte capacitor. In some embodiments the package may comprise additional decoupling capacitors.

In other embodiments the external decoupling capacitor can be in a second package attached to the same leadframe (DMP). In yet other embodiments the external capacitor can be assembled on a PCB next to the integrated circuit.

In another aspect the invention also related to a method for detecting an error of a decoupling capacitor connected to an integrated circuit. According to the method of the invention, when the driver receives a control signal from the control circuit, it launches a driving current that initiates a discharging or charging of the decoupling capacitor. In response to the current, a measurement signal (e.g., a current or voltage signal) representative of the charging or discharging is generated, which is captured by the control circuit. In the control circuit, based on a characteristic of the measured signal is determined whether an error may have occurred, for example by a comparison with a predefined threshold. An error signal can be conveyed in accordance with the result of the comparing, i.e. indicating either that there is no connection error or that indeed a malfunctioning or missing connection has been detected.

As already mentioned above, the comparing is performed at a predetermined time after the activation of the driving means. That can be while the driving means is enabled, i.e. while the driving current is provided to the decoupling capacitor or shortly thereafter, while the transient effect of the driving current is still present. As already described above, there are several ways available to carry out the comparison.

While the invention has been illustrated and described in detail in the drawings and foregoing description, such illustration and description are to be considered illustrative or exemplary and not restrictive. The foregoing description details certain embodiments of the invention. It will be appreciated, however, that no matter how detailed the foregoing appears in text, the invention may be practiced in many ways. The invention is not limited to the disclosed embodiments.

Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. An integrated circuit comprising
a voltage regulator configured to output a regulated voltage signal,
an error detection circuit for detecting an error in a connection of an electrical component, said error detection circuit configured to receive as input said regulated voltage signal and comprising
a control circuit,
a terminal arranged to connect the electrical component to the input,
a driving means coupled to said terminal and arranged to be controlled by said control circuit,
whereby said driving means is arranged to drive a current on receipt of a control signal from said control circuit and whereby said control circuit is further arranged to receive in response to said current a transient signal via said terminal, to determine based on a characteristic of the transient signal a possible error and to communicate an error signal based on said determining.

2. The integrated circuit as in claim 1, comprising a switch configured to control said input regulated voltage signal under supervision of said control circuit.

3. The integrated circuit as in claim 1, wherein said driving means is a transistor, a current source, a switch, a load or a DC/DC converter.

4. The integrated circuit as in claim 1, comprising at least one further terminal arranged to connect a further electrical component to the input and adapted to output a further signal to the control circuit, the at least one further terminal coupled to said driving means or to a further driving means.

5. The integrated circuit as in claim 1, wherein the driving means is arranged to produce one or more current pulses.

6. The integrated circuit as in claim 1, comprising an internal decoupling capacitor connected to said terminal.

7. The integrated circuit as in claim 1, wherein said driving means is connected to a ground point of the integrated circuit.

8. The integrated circuit as in claim 1, wherein said driving means is connected with a voltage different from a ground point of the integrated circuit.

9. The integrated circuit as in claim 1, further comprising a sensor configured to output a sensor signal generated by said sensor, wherein said error detection circuit is further configured to receive as input the sensor signal, said terminal comprising an output terminal for the sensor signal.

10. A system comprising an integrated circuit as in claim 1 and the electrical component, wherein the electrical component comprises an external decoupling capacitor connected to said terminal of said error detection circuit.

11. The system as in claim 10, wherein the integrated circuit further comprises an internal decoupling capacitor connected to said terminal, wherein said internal decoupling capacitor has a lower capacitance than said external decoupling capacitor.

12. The system as in claim 10, wherein said control circuit is arranged to compare with a predefined threshold a voltage over said decoupling capacitor, a discharge current or a discharge time constant.

13. A method for detecting an error of a decoupling capacitor connected to an integrated circuit, the method comprising:
providing an integrated circuit as in claim 1,
initiating via the control circuit and the driving means of the error detection circuit of said integrated circuit a discharging or charging of said decoupling capacitor,
measuring a transient signal resulting from said discharging or charging,
determining based on a characteristic of the measurement signal whether there is an error,
communicating an error signal based on said determining.

14. The method for detecting an error as in claim 13, wherein said determining is performed at a predetermined time after activating said driving means.

* * * * *